US007842882B2

(12) United States Patent
Basol

(10) Patent No.: US 7,842,882 B2
(45) Date of Patent: Nov. 30, 2010

(54) LOW COST AND HIGH THROUGHPUT DEPOSITION METHODS AND APPARATUS FOR HIGH DENSITY SEMICONDUCTOR FILM GROWTH

(76) Inventor: Bulent M. Basol, 3001 Maple Ave., Manhattan Beach, CA (US) 90266

(*) Notice: Subject to any disclaimer, the term of this patent is extended or adjusted under 35 U.S.C. 154(b) by 1520 days.

(21) Appl. No.: 11/070,835

(22) Filed: Mar. 1, 2005

(65) Prior Publication Data
US 2005/0194036 A1 Sep. 8, 2005

Related U.S. Application Data

(60) Provisional application No. 60/548,297, filed on Mar. 1, 2004, provisional application No. 60/549,160, filed on Mar. 3, 2004.

(51) Int. Cl.
*H01L 31/00* (2006.01)
(52) U.S. Cl. .................................... 136/262; 136/264
(58) Field of Classification Search ................ None
See application file for complete search history.

(56) References Cited

U.S. PATENT DOCUMENTS

| 4,003,770 A * | 1/1977 | Janowiecki et al. ............ 438/97 |
| 6,268,014 B1 * | 7/2001 | Eberspacher et al. ........... 427/74 |
| 2004/0197546 A1 * | 10/2004 | Rinzler et al. .......... 428/311.51 |
| 2005/0183767 A1 * | 8/2005 | Yu et al. ...................... 136/263 |

FOREIGN PATENT DOCUMENTS

WO WO 02084708 A2 * 10/2002 ................. 136/262

OTHER PUBLICATIONS

Norsworthy et al., "CIS film growth by metallic ink coating and selenization," Solar Energy Materials & Solar Cells, Elssevier Science B.V., p. 126-135, ( 2000).
P.R. Subramanian, et al., "The Cu-IN (Copper-Indium) System," Bulletin of Alloy Phase Diagrams, vol. 10 ( No. 5), p. 554-568, ( 1989).
P.R. Subramanian, et al., "Cu-Ga (Copper-Gallium)," Binary Alloy Phase Diagrams, p. 1410-1412.
M. Hansen, "GA-IN (Gallium-Indium)," Constitution of Binary Alloys, McGraw-Hill Book Company, p. 745-746, ( 1958).

* cited by examiner

*Primary Examiner*—Alexa D Neckel
*Assistant Examiner*—Miriam Berdichevsky
(74) *Attorney, Agent, or Firm*—Pillsbury Winthrop Shaw Pittman LLP

(57) ABSTRACT

The present invention describes a method of obtaining an absorber layer for a solar cell, That method includes depositing a preparatory material comprising a melt of at least one Group IIIA material on a base to form a precursor layer, and reacting the precursor layer with at least one Group VIA material to form a dense Group IBIIIAVIA absorber layer. The method described above can further include forming the preparatory material, the preparatory material comprising the melt of at least one Group IIIA material and a solid phase in the form of particles, such that the solid phase in the form of particles is included within the melt during the step of depositing. Various techniques for applying the preparatory material to the base as a melt are also described.

9 Claims, 8 Drawing Sheets

Form a preparatory material comprising a melt of at least one Group IIIA element

↓

Deposit preparatory material on a base forming a dense precursor layer

↓

React precursor layer to form Group IB IIIA VIA compound film

FIG. 3

LOW COST AND HIGH THROUGHPUT DEPOSITION METHODS AND APPARATUS FOR HIGH DENSITY SEMICONDUCTOR FILM GROWTH

RELATED APPLICATIONS

This application claims priority to U.S. Provisional Application Ser. No. 60/548,297 filed Mar. 1, 2004 and U.S. Provisional Application Ser. No. 60/549,160 filed Mar. 3, 2004.

FIELD OF THE INVENTION

The present invention relates to method and apparatus for preparing thin films of semiconductors and more specifically growing of compound semiconductor films as absorber layers for solar cell structures.

BACKGROUND OF THE INVENTION

Solar cells are devices that convert sunlight directly into electrical power. The most common solar cell material is silicon, which is in the form of single or polycrystalline wafers. The cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(SySe_{1-y})_k$ (where $0 \leq x \leq 1$, $0 \leq y \leq 1$ and k is approximately 2) have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

In a thin film solar cell employing a Group IBIIIAVIA compound absorber, the cell efficiency is a strong function of the molar ratio of IB/IIIA. If there are more than one Group IIIA materials in the composition, the relative amounts or molar ratios of these IIIA elements also affect the properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the Ga/(Ga+In) molar ratio. In general, for good device performance Cu/(In+Ga) molar ratio is kept at around or below 1.0. As the Ga/(Ga+In) molar ratio increases, on the other hand, the optical bandgap of the absorber layer increases and therefore the open circuit voltage of the solar cell increases while the short circuit current typically may decrease. It is important for a thin film deposition process to have the capability of controlling both the molar ratio of IB/IIIA, and the molar ratios of the Group IIIA components in the composition. It should be noted that although the chemical formula is written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation (X,Y) in chemical formula means all chemical compositions of X and Y from (X=0% and Y=100%) to (X=100% and Y=0%). For example, Cu(In,Ga) means all compositions from CuIn to CuGa.

The first technique that yielded high-quality $Cu(In,Ga)Se_2$ films for solar cell fabrication was co-evaporation of Cu, In, Ga and Se onto a heated substrate in a vacuum chamber. This technique is still popular in terms of growing absorber layers that yield high conversion efficiencies in thin film solar cell structures. However, low materials utilization, high cost of equipment, difficulties faced in large area deposition and relatively low throughput are some of the challenges faced in commercialization of the co-evaporation approach.

Another technique for growing $Cu(In,Ga)(S,Se)_2$ type compound thin films for solar cell applications is a two-stage process where at least two components of the $Cu(In,Ga)(S,Se)_2$ material are first deposited onto a substrate, and then reacted with each other and/or with a reactive atmosphere in a high temperature annealing process. For example, for $CuInSe_2$ growth, thin layers of Cu and In are first deposited on a substrate and then this stacked precursor layer is reacted with Se at elevated temperature. If the reaction also involves sulfur, then a $CuIn(S,Se)_2$ layer can be grown. Addition of Ga in the precursor layer allows the growth of a $Cu(In,Ga)(S,Se)_2$ absorber.

There are many other versions of the two-stage process that have been employed by different research groups. For example, stacked layers of sputter deposited (Cu—Ga)/In, and co-evaporated (In—Ga—Se)/(Cu—Se), and (In—Ga—Se)/Cu stacks have all been used as precursor materials which were reacted at high temperatures with S and/or Se to form the final absorber film. In two-stage processes individual thicknesses of the layers forming the stacked structure are controlled so that the two molar ratios mentioned before, i.e. the Cu/(In+Ga) ratio and Ga/(Ga+In) ratio, can be kept under control from run to run and on large area substrates.

Sputtering or evaporation techniques have been used in prior art approaches to deposit the layers containing the Group IB and Group IIIA components of the precursor stacks. In the case of $CuInSe_2$ growth, for example, Cu and In layers were sputter-deposited on non-heated substrates and then the composite film was selenized in $H_2Se$ gas or Se vapor at an elevated temperature, as described in U.S. Pat. No. 4,798,660. Such techniques suffer from high cost of capital equipment, and relatively slow rate of production.

The structure of a conventional Group IBIIIAVIA compound photovoltaic cell such as a $Cu(In,Ga,Al)(S,Se,Te)_2$ thin film solar cell is shown in FIG. 1A. The device 10 is fabricated on a substrate 11, such as of a sheet of glass, a sheet of metal, an insulating foil or web, or a conductive foil or web. The absorber film 12, which comprises a material in the family of Cu(In,Ga,Al)(S,Se,Te)2, is grown over a conductive layer 13, which is previously deposited on the substrate 11 and which acts as the electrical contact to the device. Various conductive layers comprising Mo, Ta, W, Ti, stainless steel etc. have been used in the solar cell structure of FIG. 1A. If the substrate itself is a properly selected conductive material, it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1A is called a "substrate-type" structure. A "superstrate-type" structure can also be constructed by depositing a transparent conductive layer 14a on a transparent superstrate 11a such as glass or transparent polymeric foil, and then depositing the Cu(In,Ga,Al)(S,Se,Te)$_2$ absorber film 12a, and finally forming an ohmic contact to the device by a conductive layer 13a as illustrated in FIG. 1B. In this superstrate structure, light enters the device from the superstrate side.

As reviewed above, vacuum processes such as co-evaporation and sputtering are expensive techniques. With a goal of finding an inexpensive approach to absorber layer fabrication, research groups have investigated techniques comprising the steps of: i) preparing a precursor in the form of an ink or slurry containing all or some of the elemental components of Cu(In,Ga)(S,Se)$_2$ compound, ii) depositing the ink or slurry on a substrate using methods such as spraying, doctor-blading and screen printing, to form a precursor layer, and iii) reacting the precursor layer at elevated temperatures typically with Se and/or S to from the compound film.

All of these approaches have had shortcomings. Screen printed layers, for example, did not yield high efficiency devices. Inks of metallic particles obtained by grinding larger particles, once deposited on the substrate, formed porous precursor layers. After the reaction step, these porous precursor layers yielded compound layers, which were also porous (see e.g. G. Norsworthy et al., Solar Energy Materials and Solar Cells, vol. 60, p. 127, 2000). FIG. 2 schematically shows a precursor layer 24 formed by such a prior-art method. In FIG. 2, the precursor layer 24 is deposited on the conductive film 23 on the surface of the substrate 21. The precursor layer 24 comprises particles 25, which form a matrix with voids 26 between them. The particles 25 contain at least two of the elemental components of the compound film. When such a precursor layer 24 is reacted at high temperature (e.g. 300-600° C.) with Se and S, the Cu(In,Ga)(S,Se)$_2$ compound film forms. However, the compound film is also porous like the precursor layer. Porous compound layers present problems in terms of efficient and stable solar cell performance.

Some prior-art techniques use oxide nano-powders in the formulation of the precursor inks. For example, mixtures of copper oxide, indium oxide and gallium oxide powders or compound oxides containing Cu, In and Ga are first included in an ink formulation and then deposited on a substrate to form an oxide precursor layer. The oxide precursor layer, which contains sub-micron size oxide particles, is then annealed in a reducing atmosphere to convert oxides into metals and form a layer of multi-phase Cu—In—Ga alloys, which is then reacted with Se and/or S to form the final compound. Such an approach may reduce the porosity of the alloy layer due to the annealing step in the reducing atmosphere. However, the additional process step is costly and Ga inclusion in the layer may not be efficient because Ga-oxide is difficult to reduce even in a reducing atmosphere at temperatures of around 400° C. Furthermore, when oxide layers are reduced in a reducing atmosphere, they de-wet their substrates forming a highly non-uniform precursor layer; non-uniform in thickness and composition.

As the brief review above demonstrates, there is still need to develop low-cost deposition techniques to form high-quality dense Group IBIIIAVIA compound thin films as solar cell absorber layers.

SUMMARY

The present invention describes, in one embodiment a method of obtaining an absorber layer for a solar cell, That method includes depositing a preparatory material comprising a melt of at least one Group IIIA material on a base to form a precursor layer, and reacting the precursor layer with at least one Group VIA material to form a dense Group IBIIIAVIA absorber layer.

In another preferred embodiment, the method described above further includes forming the preparatory material, the preparatory material comprising the melt of at least one Group IIIA material and a solid phase in the form of particles, such that the solid phase in the form of particles is included within the melt during the step of depositing.

In a further preferred embodiment, there is included the step of forming the preparatory material as a dry powder comprising particles or a dispersion, and the step of depositing directs the particles or the dispersion toward the base through a hot zone located in proximity to the base.

In other embodiments, a completed solar cell is obtained by depositing at least one transparent layer over the absorber layer or making the base transparent and depositing an ohmic contact on the Group IBIIIAVIA layer to form a solar cell.

BRIEF DESCRIPTION OF THE DRAWINGS

The present invention is illustrated by way of example, and not limitation, in the figures of the accompanying drawings in which like references denote similar elements, and in which:

FIG. 3 is a flow chart showing the general steps of a method used to form a Group IBIIIAVIA compound film, in accordance with one preferred embodiment of the present invention.

DETAILED DESCRIPTION OF THE INVENTION

The general process steps of one of the embodiments of the present invention are shown in FIG. 3. The first step is formation of a preparatory material comprising a melt of at least one Group IIIA element. During the second step, the preparatory material is deposited on a surface of a base to form a precursor film with high density. During the third step of the process, the precursor film is reacted to form a Group IBIIIAVIA compound film or layer. In addition to the at least one Group IIIA element, the preparatory material may also contain at least one Group IB element. The surface of the base on which the preparatory material is deposited may comprise at least one Group IB element. During the step of reacting, the precursor layer may be reacted with at least one Group VIA material (Se, S, Te). Formulation of the preparatory material may change depending on many factors as will be described in more detail below.

Figure 4:
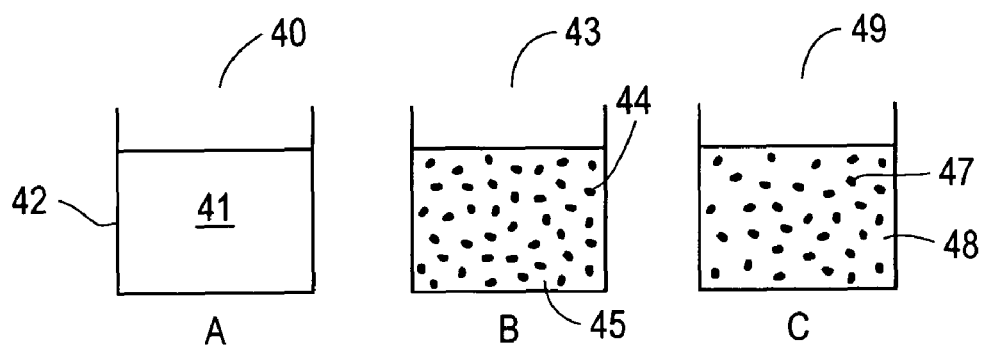
FIG. 4A shows a preparatory material comprising a melt.
FIG. 4B shows a preparatory material comprising a melt and solid particles dispersed in it.
FIG. 4C shows a preparatory material comprising an emulsion.

In a first embodiment of the present invention the preparatory material comprises a melt of at least one of the Group IIIA components of the Group IBIIIAVIA compound. The melt, in addition to the at least one of the Group IIIA components, may also contain a Group IB component. Accordingly, for $Cu(In,Ga)(S,Se,Te)_2$ film growth, for example, the melt may substantially be; i) molten Ga, ii) molten In, iii) molten Ga and In, iv) molten Cu and Ga and In, v) molten Cu and In, and vi) molten Cu and Ga. It should be noted that, in this embodiment, all elements, components or materials in the melt are molten and the preparatory material is a liquid as depicted in FIG. 4A. As seen in FIG. 4A, the preparatory material 40 is in the form of a melt 41 contained in container 42. Other liquid materials may also be included in the melt at impurity levels to help improve the quality of the absorber layer to be formed. Such additional materials include dopants such as Na, K, Li, P, Sb, Bi etc. Small amounts of (such as less than 5 atomic percent) Group VIA materials such as S, Se, Te may also be added to the melt as long as the temperature of the melt is high enough to keep everything in liquid form.

In another embodiment of the invention, the preparatory material, in addition to the melt described above, also contains nano-size solid particles with largest dimensions being smaller than about 500 nm, preferably less than 200 nm. This is schematically shown in FIG. 4B, where the preparatory material 43 comprises solid particles 44 dispersed in a melt 45. As in the previous embodiment the melt 45 comprises at least one of the Group IIIA components of the Group IBIIIAVIA compound. The melt 45, in addition to the at least one of the Group IIIA components, may also contain a Group IB component. The solid particles 44 may comprise at least one Group IB material. For example, for $Cu(In,Ga)(S,Se,Te)_2$ film growth, the melt 45 may be substantially molten Ga, or substantially molten In, or substantially molten Ga and In, and the solid particles 44 may comprise materials such as Cu, Cu-oxides, Cu salts such as chlorides and sulfates, Cu—Ga alloys, Cu—In alloys, Cu—Se alloys or compounds, Cu—S alloys or compounds, Cu—Te alloys or compounds, or multinary compounds or alloys containing Cu and at least two of S, Se and Te. The solid particles 44 may also comprise Group IB, Group IIIA and Group VIA elements or their compounds. In this embodiment the temperature of the melt 45 should be low enough so that the solid particles 44 do not become liquid. For the present example of $Cu(In,Ga)(S,Se,Te)_2$ film growth, as the Cu content of the melt 45 is reduced and the Group IIIA material (In and/or Ga) content is increased, the temperatures at which the melt stays molten get reduced. For example, melts with Cu/(Ga+In) ratio close to 1.0 require over 500° C. to stay liquid, however, melts containing only In or In and Ga stay molten below 156° C. In fact as we will see later, for specific Ga and In mix ratios, the melting temperature can be lowered to below the room temperature of 25° C. Therefore, in this embodiment the Cu content of the melt 45 is preferably reduced and the reduced amount of Cu is included in the solid particles 44 so that the total average Cu/(In+Ga) ratio in a unit volume of the preparatory material comprising "melt+solid particles" is in the desired range. In the extreme case of a melt that is free of Cu, the melt may be composed of In, or Ga or In+Ga and the solid particles may be nano-particles of pure Cu with dimensions less than 500 nm, preferably less than 200 nm. Obviously nano-particles of other Cu-rich alloys or compounds cited before (such as Cu—In alloys, Cu—Ga alloys, Cu—Se alloys or compounds etc) may also be used. Other nano-particles of other substances may also be added to the melt of the preparatory material. These include dopants and nano particles of S, Se, Te among others. Since melting temperature of a In+Ga composition without any Cu is below 156° C., solid particles may be dispersed effectively in such melts. Surface-active agents and other additives may be added in the formulation to help form such dispersion. Solid particles may additionally be coated with films of other materials to help their dispersion in the melt. If the solid particle content is increased then the preparatory material may become a slurry rather than a freely flowing liquid and may be deposited on the base using slurry deposition techniques.

Once formed, the preparatory material is deposited on a surface of a base and a precursor film is formed. During the third step of the process, the precursor film is reacted to form the Group IBIIIAVIA compound layer.

As stated above, the preparatory material comprises a melt of either the Group IIB and Group IIIA materials or only Group IIIA materials. Selection of the composition of the melt depends on certain factors, one of which is the base it will be deposited on. Various embodiments of the present invention will now be further described for the growth of a $Cu(In,Ga)Se_2$ layer as an example. It should be understood that the invention is applicable, in general, to the growth of $(Cu,Ag)_x(In,Ga,Al,Tl)_y(S,Se,Te,O)_z$ type compound films with various x, y and z values, including but not limited to layers of $CuInSe_2$, $CuGaSe_2$, $CuInS_2$, $CuGaS_2$, $CuIn(S,Se)_2$, $CuGa(S,Se)_2$, $Cu(In,Ga)Se_2$, $Cu(In,Ga)S_2$, and $Cu(In,Ga)(S,Se)_2$. It should be noted that there are also other Group IBIIIAVIA compounds (such as $CuIn_3Se_5$) where IB/IIIA molar ratio and (IB+IIIA)/VIA molar ratio are widely varied. The present invention is applicable to the growth of layers of such materials also.

Example 1

Use of a Preparatory Material Melt Containing Cu

Figure 5A:
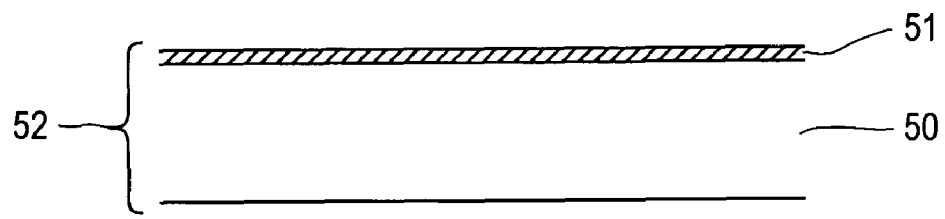
FIG. 5A shows an exemplary base comprising a substrate coated with a conductor.
Figure 5B:
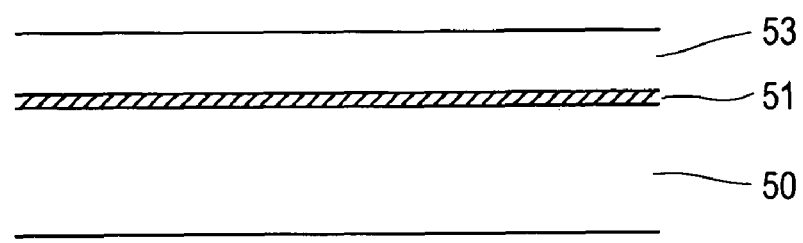
FIG. 5B shows a dense precursor layer deposited on a base using a preparatory material comprising a melt.
Figure 8:
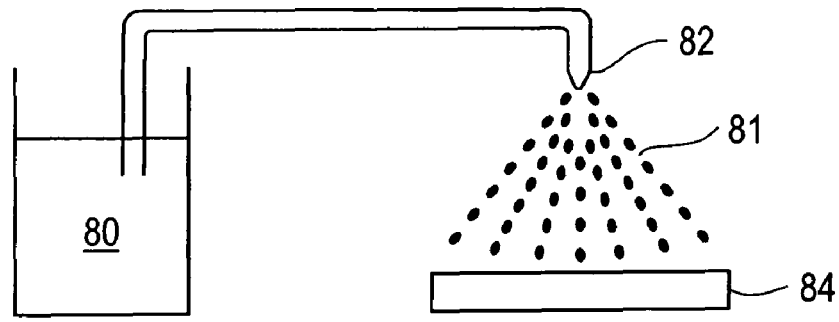
FIG. 8 is a schematic of a system used for deposition of layers in accordance with a preferred embodiment of the present invention.

Cu, In and Ga pieces or ingots are separately weighed, and controlled amounts of each element are mixed and melted together to form a melt with the pre-determined Cu/(In+Ga) and Ga/(Ga+In) ratios. For solar cells, the desired Cu/(In+Ga) molar ratio is usually in the 0.5-1.1 range, preferably in the 0.7-1.0 range, and the Ga/(Ga+In) ratio is in the 0-1.0 range, preferably in the 0.05-0.3 range. As may be deduced from the binary diagrams of Cu—In (P. R. Subramanian and D. E. Laughlin, "Bulletin of Alloy Phase Diagrams", vol. 10, No: 5, p. 554, 1989) and Cu—Ga (P. R. Subramanian and D. E. Laughlin, "Binary Alloy Phase Diagrams", page 1410) a ternary containing Cu, In, and Ga with the molar ratios cited above may be in liquid form at above 500° C. To protect the melt from oxidation at high temperature, the melt such as the one depicted in FIG. 4A, may be in a container and kept in an inert atmosphere such as an inert gas atmosphere or vacuum during its formation and use. The base 52 comprises a substrate 50, which is coated with a conductor 51 as shown in FIG. 5A. The conductor 51, does not contain any consequential amount of Cu, In or Ga to influence the molar ratios of the precursor layer to be deposited, and it is selected from a group of materials that form good ohmic contact to $Cu(In,Ga)Se_2$. Such materials include Mo, Ta and W. During the second step of the process, the melt is deposited on the base shown in FIG. 5A to form a precursor layer 53 as shown in FIG. 5B. The precursor layer 53 does not have much porosity since it is deposited from a dense melt through a method that keeps the melt substantially in liquid form until the precursor layer 53 is formed and solidified on the base. This can be achieved through various different deposition techniques such as melt spraying, liquid printing, direct drawing with micro-dispensers, dipping and spin coating. In spraying, which is schematically shown in FIG. 8, the hot metallic melt 80 is broken into micron or sub-micron size droplets 81 by a heated nozzle 82 or atomizer and directed onto the base 84, which is preferably heated. When the droplets 81 hit the top surface of the base 84, they flatten, merge with each other and form a continuous precursor layer, which preferably has a thickness in the 1-5 microns range. In this process the base may be heated to a temperature of 100-600° C. and the droplets may travel from the spraying nozzle to the base through heated and inert atmosphere or vacuum so that they do not react with the atmosphere or fully solidify by the time they hit the surface of the base. It should be noted that spraying is given as one out of many examples of melt deposition techniques mentioned above, which may be used to practice the present invention. Copper content of the melt may be reduced, reducing its melting temperature. In this case the balance of Cu needed to achieve the desired Cu/(In+Ga) molar ratio in the precursor layer may be supplied from the base. For example, it is possible to use a base shown in FIG. 6A, which comprises a substrate 60, a conductor 61, which forms the ohmic contact to the solar cell once fabricated, and a sublayer 62. The sublayer 62 is a Cu-rich layer. Accordingly, the sublayer 62 may be a Cu layer, a Cu—In layer with a Cu/In ratio of larger than 1.0, a Cu—Ga layer with a Cu/Ga ratio of larger than 1.0, or a Cu—In—Ga layer with Cu/(In+Ga) ratio of larger than 1.0. Preferably, the sublayer 62 is a Cu layer. In this case the melt with reduced Cu content is deposited onto the sublayer 62, forming a melt-derived film 63 as shown in FIG. 6B. In this case the precursor layer 64 is defined as the layer on top of the conductor 61. In other words the precursor layer 64 is a composite layer comprising the sublayer 62 and the melt-derived film 63. The thicknesses of the Cu sublayer 62 and the melt-derived-film 63 are adjusted such that the Cu/(In+Ga) ratio of the total precursor layer 64 is at the desired value. For example, if the desired Cu/(Ga+In) and Ga/(Ga+In) ratios are 1.0 and 0.3, respectively, this would require deposition of 0.3 microns of Cu, 0.5 microns of In and 0.13 microns of Ga if these layers were separately deposited. Therefore, similar ratios may be obtained in a precursor layer prepared by depositing a melt comprising Cu, In, and Ga, on a Cu sublayer, which may be 0.2 microns thick. In this case it is straightforward to calculate that a melt with Cu/(In+Ga) ratio of 0.33 and Ga/(Ga+In) ratio of 0.3 may be used and approximately 0.73 microns thick melt-derived film may be deposited over the Cu sublayer to obtain the desired result. It should be understood that these are approximate calculations without taking into account possible density changes when the elements are alloyed.

Example 2

Use of a Preparatory Material Melt, which is Free of Cu

To lower the overall process temperature, melts that are liquid at temperatures below 156° C. may be employed in the present invention by excluding Cu from the melt composition. This can be achieved in two ways for processing the exemplary $Cu(In,Ga)Se_2$ compound layer.

Figure 6A:
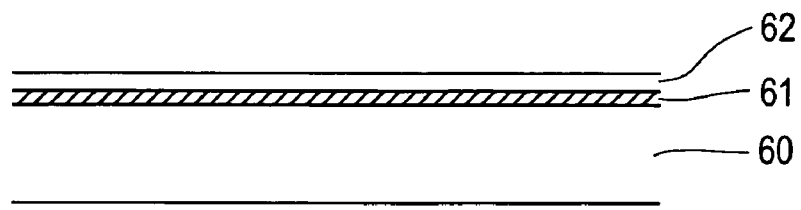
FIG. 6A shows a base, comprising a substrate, a conductor and a sublayer.
Figure 6B:
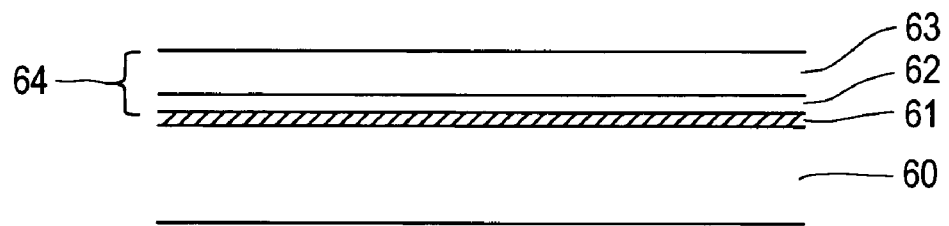
FIG. 6B shows a dense melt-derived film deposited on the base of FIG. 6A to form a dense precursor layer.

The first approach is to use a preparatory material such as the one depicted in FIG. 4A and a base of FIG. 6A employing a sublayer 62, which is Cu. The preparatory material in this case is a melt, containing Ga and/or In, and the melt is deposited on a sublayer of Cu to form a precursor layer (see FIG. 6B). The thicknesses of the Cu sublayer and the melt-derived film comprising In and Ga are controlled so that the desired Cu/(In +Ga) ratio is obtained in the composite precursor. The Ga/(Ga+In) ratio is fixed in the melt. For example, for $CuIn_{0.7}Ga_{0.3}Se_2$ growth with Cu/(In+Ga) ratio of 1 and Ga/(Ga+In) ratio of 0.3, a substrate, such as glass or metallic foil is first coated with a contact layer such as Mo, which makes good ohmic contact to $CuIn_{0.7}Ga_{0.3}Se_2$. A copper layer is deposited on the Mo surface. This copper layer may be, for example, 0.6 microns thick. A melt is prepared containing Ga and In with a Ga/(Ga+In) molar ratio of 0.3, and deposited on the Cu layer to a thickness of about 1.3 microns. The melt is prepared by weighing Ga and In separately in the required proportion and then heating them together. As shown by the phase diagram of Ga—In (M. Hansen, "Constitution of Binary Alloys", McGraw-Hill Book Company, 1958, page 745), which is schematically replicated in FIG. 7, the Ga—In mix with the above ratio will melt at about 85° C., which is a lower temperature than the melting temperature of In only, which is 156° C. Melts containing In and Ga are preferred in the present invention since they stay liquid at low temperatures. It should be noted that the melting temperature of Ga—In alloys reduce with increasing Ga content and reaches a minimum of less than 20° C. at an approximate Ga/(Ga+In) ratio of 0.84. Because of the low temperatures involved, Ga—In melts may be deposited on the copper layer of our example through a variety of techniques including spraying, doctor blading, dipping, spinning and printing and microdrop writing.

Present inventor also detected a property of In and/or Ga melts, which may be used to benefit in this invention. When the melts of these elements or the melts of their alloys are placed on a conductive surface such as the surface of an ohmic contact material to the solar cell, they wet the conductive surface well if they are also physically rubbed against the surface using a soft material such as a buffing wheel, a piece of felt, cloth or cotton. This is a "mechanical" deposition approach which is effectively used to form thin layers of In, Ga or In—Ga alloys on Mo, W, Cu, Ta, glass, stainless steel surfaces and on other metal and insulator surfaces. The approach is also valuable to treat the surfaces of metals and insulators with Ga, In, or In—Ga alloys. This way the surfaces are prepared for the deposition of secondary layers on them. Presence of the extremely thin In or Ga on the treated surface enhances adhesion and wetting of any deposited secondary layer to the treated surface. The treatment process comprises a mechanical deposition step followed by wiping the deposited surface with clean soft materials such as a buffing wheel or cylinder. This way all excess In and/or Ga is wiped off the surface leaving behind a surface uniformly coated with a very thin layer which may be less than 100 nm in thickness, preferably less than 50 nm in thickness.

Referring back to FIG. 6B, during the deposition of the melt, the temperature of the base may be controlled in the range of about 10-160° C. to control solidification of the melt when it is delivered onto the substrate. For CuGaSe2 growth, pure Ga is melted and deposited on the substrate. The melting temperature of Ga is about 30° C. For CuInSe2 growth, In melt at or above 156° C. can be used. It should be noted that to improve the wetting of the surface of the sublayer 62 by the melt the sublayer surface may be first treated by In and/or Ga melt as described above, before depositing the melt-derived film 63.

Figure 5C:
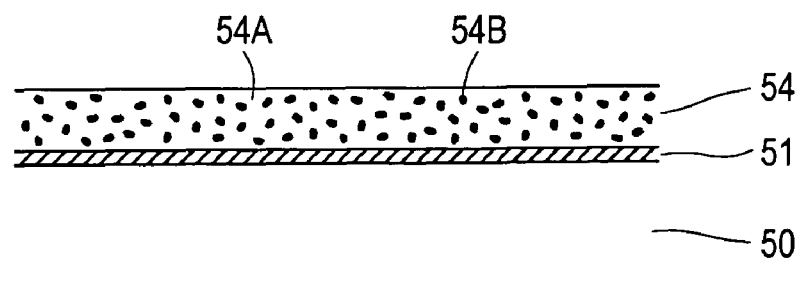
FIG. 5C shows a dense precursor layer deposited on a base using a preparatory material comprising a melt and solid particles dispersed in it.

As described before, a preparatory material may contain a Cu-free melt, and Cu-rich solid particles (see for example FIG. 4B). In this case the preparatory material may be deposited on a base such as the one shown in FIG. 5A, to obtain a precursor layer 54 as shown in FIG. 5C. The precursor layer 54 in this case comprises portions 54A that are formed from the melt of the preparatory material and thus contain In and Ga, and solid particles 54B that are the same solid particles that were in the formulation of the preparatory material. The precursor layer 54 is dense because of the melt content of the preparatory material. It should be noted that the total IB/IIIA ratio and the ratios of the Group IIIA elements in the precursor layer 54 are the same as in the preparatory material. It is also possible to deposit the preparatory material of FIG. 4B on a base such as the one shown in FIG. 6A and adjust the Cu amount in the particles 44 and the sublayer 62 so as to obtain the desired molar ratios in the final precursor layer 64. Use of various combinations of methods mentioned above to form a precursor layer should be obvious to those skilled in the art.

Cu-rich sublayers (FIG. 6A) may be deposited on the conductor 61 by various well known techniques such as sputtering and evaporation. Two especially attractive techniques, however, are ink deposition and electrodeposition. These are low-cost methods that can be used for high throughput processing. In ink deposition approach, nano-powders of Cu or Cu-rich Cu—Ga alloy, or Cu—Ga solid solution or Cu-rich Cu—In alloy, or Cu—In solid solution or Cu-rich Cu—In—Ga alloys are formulated into dispersions and deposited on the substrate by methods such as spraying, spin coating, printing, writing, and doctor blading to form a Cu-rich layer. Cu-oxide inks may also be used for this purpose. However, after depositing the Cu-oxide ink in the form of a thin layer, the base is preferably annealed in reducing atmosphere to convert the thin Cu-oxide layer into metallic Cu. This may be achieved at 150-350° C. range in hydrogen or carbon monoxide atmosphere.

Figure 6C:
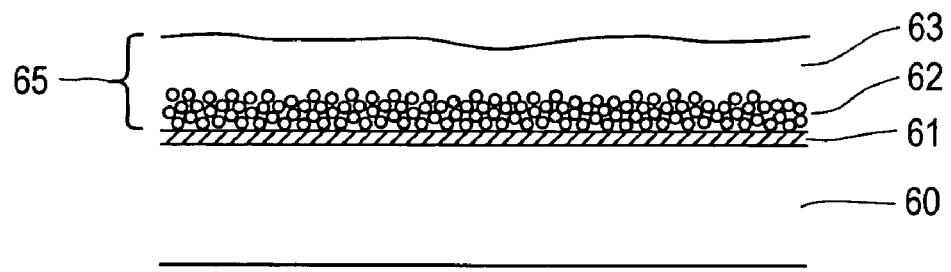
FIG. 6C shows a precursor layer formed on a base, precursor layer comprising a melt-derived film over a porous sublayer.
Figure 6D:
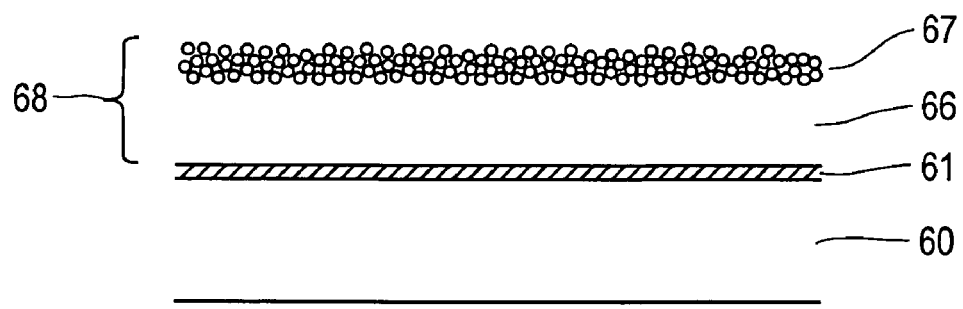
FIG. 6D shows a precursor layer formed on a base, precursor layer comprising a porous film over a melt-derived dense film.

FIG. 6C shows a precursor structure 65 obtained after depositing a melt-derived film 63 over a sublayer 62, which may be obtained by one of the ink deposition techniques described above. The precursor structure is on a conductor 61, which is previously coated on a substrate 60. The sublayer 62 has some porosity because it is deposited from an ink comprising Cu-rich particles, such as Cu particles. Melt-derived film 63, which for example comprises Ga and In is dense. It should be noted that the melt-derived film 63 helps fill in the pores in the porous sublayer 62 since melt-derived film 63 is deposited using a low-melting-temperature liquid of an In—Ga composition and it is in the form of a liquid when it arrives on the sublayer 62. The deposition order of the melt-derived film and the Cu-rich sublayer may be reversed. In other words the melt-derived film may be first deposited over the conductor and then a Cu-rich layer may be deposited over the melt-derived film. This may be followed with a brief anneal step, especially if the Cu-rich layer is porous, to assure that low-melting melt-derived film materials (In and/or Ga) help reduce the porosity by flowing into the pores. The anneal temperature for this purpose may be in the 50-200° C. for 1-15 minutes in air, reducing atmosphere, vacuum or inert atmosphere. FIG. 6D shows the case where a Group IIIA-rich, for example In or Ga-rich, sublayer 66 is first deposited on the conductor 61. A Cu-rich layer 67 is then deposited over the sublayer 66. The sublayer in this case may be deposited by various methods such as melt deposition, electrodeposition etc. The Cu-rich layer is deposited using an ink comprising Cu-rich particles and therefore, may have porosity. The precursor layer 68, which is a composite layer, may be annealed in a suitable atmosphere at a temperature that is higher than the melting temperature of the sublayer 66. The melt from sublayer 66 wets the pores of the Cu-rich layer 67 and flows into the pores forming a substantially dense precursor layer.

As stated above, referring to FIG. 6B, the sublayer 62 may be Cu and it may be deposited by electrodeposition. Electrodeposition of Cu can be achieved using well-known electrolytes containing sulfuric acid, copper sulfate, water, Cl and optionally organic additives such as suppressors and levelers. In this case the sublayer 62 is a dense layer.

Example 3

Using an Emulsion Preparatory Material

Figure 7:
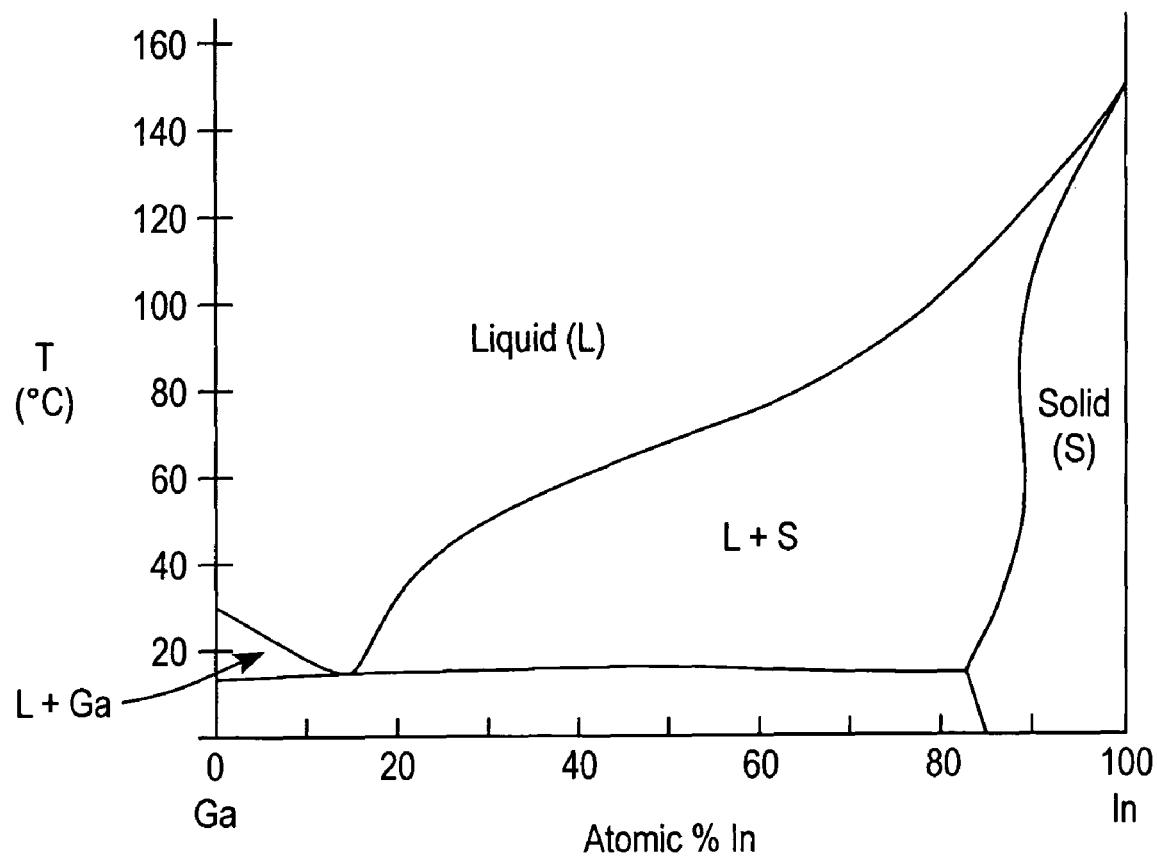
FIG. 7 is a schematic of a binary phase diagram of Ga—In material system.

The word "dispersion" is generally used to identify a composite fluid comprising solid particles. Dispersion is prepared by dispersing solid particulates in a liquid. Emulsion, on the other hand, is a dispersion of one liquid in a second immiscible liquid. Commonly known emulsions include, for example, oil dispersed in water. Emulsification is typically achieved through the help of surfactants. The fact that In—Ga melts stay liquid at low temperatures (see FIG. 6), makes it possible to use these melts as one of the liquid phases in an emulsion. The second liquid that is immiscible with the In—Ga melt may be water, organic liquids such as glycerol or any other liquid that can be heated to or above the melting temperature of the In—Ga composition used. As can be seen in FIG. 7, melting temperatures of In—Ga compositions vary from about 156° C. for pure In to about 15.7° C. for a composition with 16.5 atomic percent In. Therefore, there is a wide variety of choices, including water, as immiscible liquids to employ in the preparation of an In—Ga emulsion.

FIG. 4C schematically shows an exemplary emulsion containing an In—Ga melt as one of the liquid phases. The In—Ga melt particles 47 are dispersed in a base liquid 48 in a container forming a preparatory material 49. The base liquid 48 is immiscible with In—Ga melt. The emulsion is kept at a temperature that is higher than the melting temperature of the melt particles 47. Melt particles 47 are less that 10 microns in diameter, preferably less than 1 micron. Once prepared, the emulsion may be deposited on a base, such as the one shown in FIG. 5A or 6A, using any one of many dispersion deposition techniques such as spraying, doctor blading or printing. It should be appreciated that use of an emulsion differ from use of a melt in that, the emulsion is more diluted than the melt in terms of its In—Ga content per unit volume of liquid delivered to the surface of the base. Therefore, a thick layer of emulsion deposited on the base would yield a thin layer of the melt after the base liquid is removed from the base. For example, if the melt particles constitute 10% of the volume of the emulsion FIG. 4C, when 15 micron thick layer of this emulsion is deposited on a base, about 1.5 micron of melt layer may be obtained on the base after the base liquid is evaporated away. This approach is especially attractive to obtain very thin melt-derived films and may be achieved by spraying the emulsion on heated base. Alternately, the emulsion may be sprayed onto the base through a heated atmosphere. This way as emulsion particles comprising the immiscible liquid and the In—Ga melt pass through the heated atmosphere and travel towards the base, the immiscible liquid or the base liquid may be evaporated off, leaving behind the In—Ga melt particles, which are delivered onto the base forming the melt-derived film.

Example 4

Use of Melts with a Removable Secondary Phase

In another embodiment a preparatory material comprising a melt and removable secondary phase particles is prepared. In this case, the preparatory material is like shown in FIGS. 4B and 4C, however, the particles dispersed in the melt are either solid or liquid and they comprise a secondary phase which is removable. For example, the particles dispersed in the melt may comprise organic matter, which, after deposition on the base may be burned off at high temperature, reducing the thickness of the remaining film. They may also be a removable liquid phase that is evaporated away after deposition on the base, again reducing the thickness of the melt-derived film. The removable secondary phase particles may be considered as "filler particles" that take up volume in the preparatory material. For example, if filler particles take up 20% of the volume of the preparatory material (80% being the melt), when a 4 micron thick film is deposited using the preparatory material, the melt-derived film thickness would be 80% of 4 micron, or 3.2 microns after the filler particles are removed.

Examples 1-4 above discussed different ways of carrying out the second step of the present invention as depicted in FIG. 3. Referring to FIG. 3 the third step of the invention is the reaction of the precursor layer. This may be achieved various ways. In one embodiment the precursor layer is exposed to Group VIA vapors at elevated temperatures. These techniques are well known in the field and they involve heating the precursor layer to a temperature range of 350-600° C. in the presence of at least one of Se vapors, S vapors, and Te vapors provided by sources such as solid Se, solid S, solid Te, $H_2Se$ gas, $H_2S$ gas etc. In another embodiment a layer or multi layers of Group VIA materials are deposited on the precursor layer and the stacked layers are then heated up in a furnace or in a rapid thermal annealing furnace and like. Group VIA materials may be evaporated on, sputtered on or plated on the precursor layer. Alternately inks comprising Group VIA nano particles may be prepared and these inks may be deposited on the precursor layers to form a Group VIA material layer comprising Group VIA nano particles.

Reaction may be carried out at elevated temperatures for times ranging from 1 minute to 30 minutes depending upon the temperature. As a result of reaction, the Group IBIIIAVIA compound is formed from the precursor. Use of the dense precursor layers of the present invention yields dense compound layers for high quality solar cell fabrication.

Figure 1A:
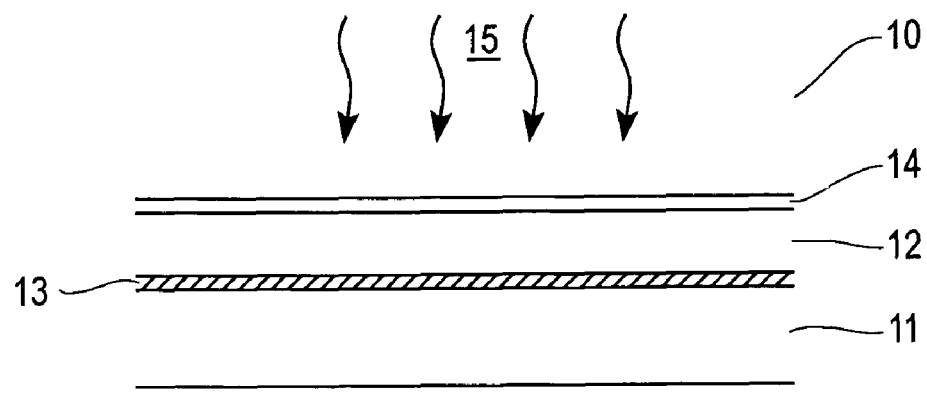
FIG. 1A is a cross-sectional view of a substrate-type solar cell employing a Group IBIIIAVIA absorber layer.
Figure 1B:
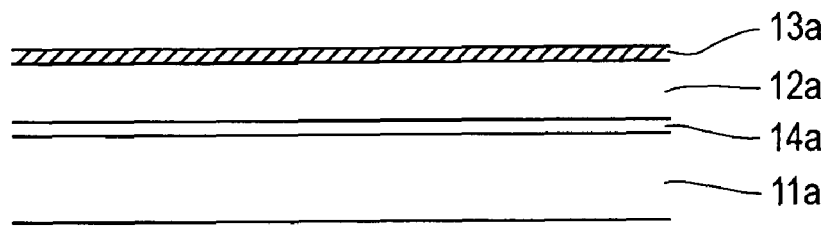
FIG. 1B is a cross-sectional view of a superstrate-type solar cell employing Group IBIIIAVIA absorber layer.
Figure 2:
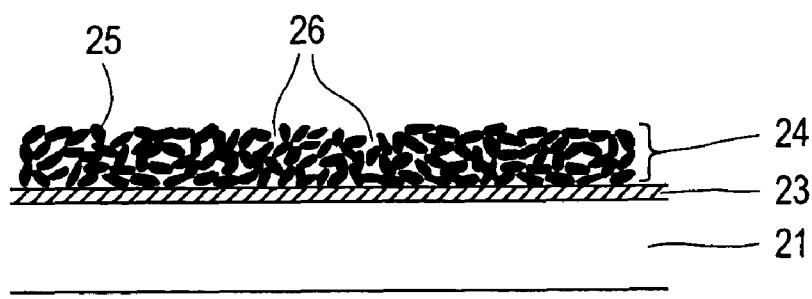
FIG. 2 shows a porous precursor layer formed by a prior art technique.

Solar cells are completed using a variety of materials and methods. For example a thin (<0.1 microns) CdS layer may be deposited on the surface of the compound layer using the chemical dip method for both the "substrate-type" and superstrate structures as illustrated in FIGS. 1A and 1B. The In both structures ZnO may be used as the transparent window. ZnO may be deposited using MOCVD or sputtering techniques. A metallic finger pattern is optionally deposited over the ZnO to complete the solar cell for the structure of FIG. 1A. The rather porous prior-art absorber layers shown in FIG. 2 suffered from a large surface roughness and large internal surface area. Both of these factors are detrimental to solar cell efficiency and stability. Large internal surfaces, i.e. surfaces of the pores within the film cause instabilities as these surface adsorb impurities from the atmosphere and start influencing charge distribution within the semiconductor grains. Excessive oxidation, or impurity inclusion in these surfaces affect energy band bending and therefore built-in potential and the solar cell performance deteriorates as more and more impurities continue to adsorb on the surfaces. The surface morphology or roughness, on the other hand affect the quality of the junction made on the absorber. To fabricate a solar cell structure such as the one shown in FIG. 1A for example, a very thin (<100 nm) CdS film may have to be deposited on the rough top surface of the absorber of FIG. 2. The surface roughness increases the effective junction area and therefore decreases the effective saturation current, yielding lower voltage values. Furthermore if the CdS layer is deposited by a wet technique such as the chemical dip method, the deposition solution seeps into the pores of the absorber layer and deposits CdS on the internal surfaces where presence of CdS is undesirable and deteriorates the device performance. The dense precursor layers of the present invention result from the deposition of molten material on the substrate. Compound layers obtained from such precursors are also dense and the solar cell junctions formed on the dense compound layers do not suffer from low efficiency or instabilities.

Figure 9:
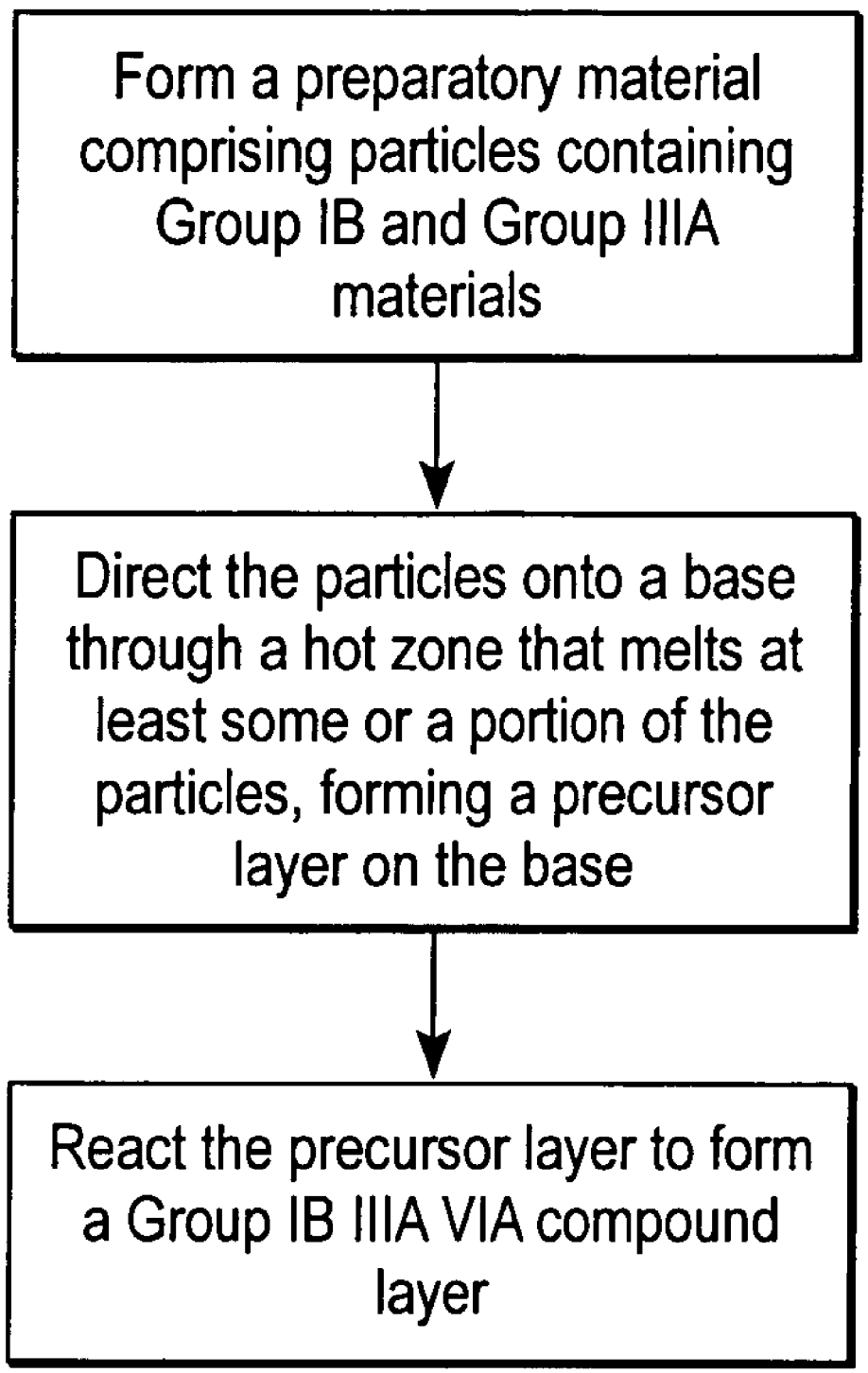
FIG. 9 is a flow chart showing the general steps of a method used to form a Group IBIIIAVIA compound film, in accordance with another embodiment of the present invention.

The general processing steps of another embodiment of the present invention are shown in FIG. 9. The first step is the formation of a preparatory material comprising nano-particles containing Group IB, and Group IIIA materials. During the second step, the nano-particles are directed towards a surface of a base through a hot zone so that at least some, or a portion of the nano-particles melt going through the hot zone before depositing onto the surface. The molten material droplets help form a dense precursor layer on the base. During the third step of the process, the dense precursor layer is reacted in a suitable atmosphere to form a Group IBIIIAVIA compound layer.

In one embodiment of the present invention the preparatory material comprises dry nano-particles. The largest dimension of the particles may be smaller than about 500 nm and preferably smaller than 100 nm. The particles contain at least one of Group IB and Group IIIA components of the Group IBII-IAVIA compound. Accordingly, for Cu(In,Ga)(S,Se,Te)$_2$ film growth, for example, the preparatory material may comprise; i) Cu particles and In—Ga particles, ii) Cu—Ga particles and In particles, iii) Cu—In particles and Ga particles, iv) Cu—Ga particles and In—Ga particles, v) Cu—In particles and In—Ga particles, vi) Cu—Ga particles and Cu—In particles, vii) Cu—In—Ga particles, and viii) various combinations of i-vii. For the purposes of describing the present invention In—Ga particles mean particles comprising In and Ga either in elemental form or alloy form, or solid solution form such as In$_{(1-x)}$Ga$_x$ form where x is smaller than or equal to 0.1 (see e.g., M. Hansen, "Constitution of Binary Alloys", McGraw-Hill Book Company, 1958, page 745). Similarly, Cu—In particles mean particles each comprising Cu and In, either in elemental form, or single phase alloy form such as Cu$_{11}$In$_9$, CuIn$_2$, Cu$_7$In$_4$ and other discrete alloy phases cited in the reference (P. R. Subramanian and D. E. Laughlin "The Cu—In system," Bulletin of alloy phase diagrams, vol. 10, no. 5, p. 554, 1989), or multi-phase alloy form where each particle has more than one of the above alloy phases and elemental phases, or solid solution form such as Cu$_{(1-x)}$In$_x$ where x is smaller than or equal to about 0.1. Cu—Ga particles mean particles each comprising Cu and Ga, either in elemental form, or single phase alloy form such as Cu$_9$Ga$_4$, Cu$_3$Ga$_2$, CuGa$_2$ and other distinct phases cited in the reference (P. R. Subramanian and D. E. Laughlin "Cu—Ga", Binary alloy phase diagrams, p. 1410), or multi-phase alloy form where each particle has more than one of the above alloy phases and elemental phases, or solid solution form such as Cu$_{(1-x)}$Ga$_x$ where x is less than or equal to about 0.2. Cu—In—Ga particles mean, particles each comprising Cu, In, and Ga either in elemental form, or single phase alloy form, or multi-phase alloy form, or solid solution form. To clearly present the important aspects of the invention, we will now continue describing the first two steps of the invention for formation of a Cu$_{0.8}$In$_{0.8}$Ga$_{0.2}$Se$_y$ compound film (where y may be close to 2) using a specific preparatory material composition as an example. The compound film of this example, after completion of the third step of FIG. 9, would have a Cu/(In+Ga) ratio of about 0.8 and Ga/(Ga+In) ratio of about 0.2.

Figure 10:
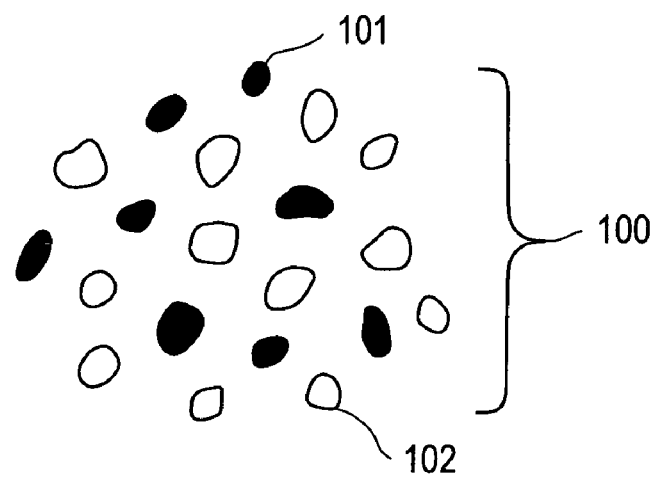
FIG. 10 shows a preparatory material comprising particles.

FIG. 10 shows a preferred composition of a preparatory material 100 comprising Cu—Ga solid solution particles 101 and In particles 102. The composition of Cu—Ga solid solution particles may be Cu0.8Ga0.2. It should be noted that unlike multi-phase alloy particles, the Cu—Ga solid solution particles containing less than 20 atomic percent Ga are easy to prepare in fine nano-powder form. Cu—Ga solid solutions do not have low melting temperatures. They melt at over 915° C. They can be formed just like Cu particles, which may be obtained down to sizes of about 10 nm. One method of preparing Cu—Ga solid solution nano-particles is to prepare a Cu—Ga solid solution bulk material and then vaporize this material (such as by sputtering or evaporation) into an inert gas environment. When vapor particles condense in the inert gas environment they form a powder with nano-size particles. If a liquid dispersion of the nano-particles is desired than the vaporization may be done into an environment comprising a dispersing liquid such as alcohol or other organic liquid. Vapor particles then condense in the dispersing liquid forming nano-size particles dispersed in the liquid.

As described above, the preparatory material of FIG. 10 is a mixed powder comprising Cu$_{0.8}$Ga$_{0.2}$ particles and In particles. The preparatory material is obtained by mixing each mole of the Cu$_{0.8}$Ga$_{0.2}$ powder with 0.8 moles of the In powder. This way the average composition of the mixed-powder preparatory material is Cu$_{0.8}$Ga$_{0.2}$In$_{0.8}$, and the Cu/(In+Ga) and Ga/(In+Ga) ratios are 0.8 and 0.2, respectively. The size of the Cu—Ga solid solution particles and the In particles may be smaller than 500 nm, preferably smaller than 100 nm. Although their shape is shown rounded in FIG. 10, they may be of any shape and form. The particles may be mixed well in dry form or they may be mixed in a solvent and then the solvent may be evaporated leaving behind a well-mixed preparatory material.

Figure 11A:
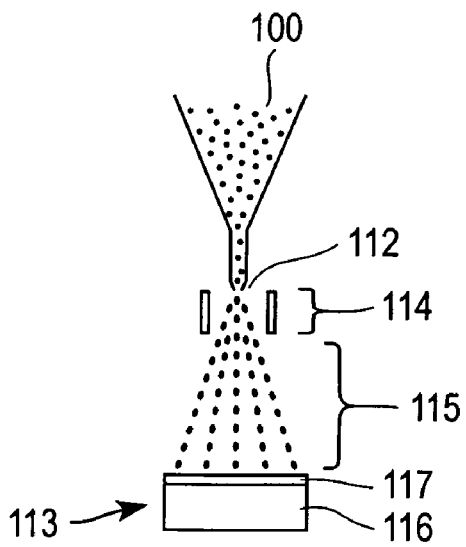
FIG. 11A shows an apparatus used to form a dense precursor layer on a base in accordance with the present invention.
Figure 11B:
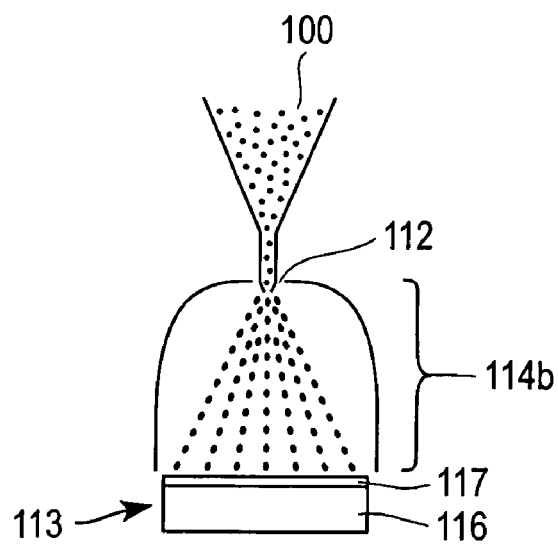
FIG. 11B shows an apparatus with large hot zone used to form a dense precursor layer on a base in accordance with the present invention.
Figure 11C:
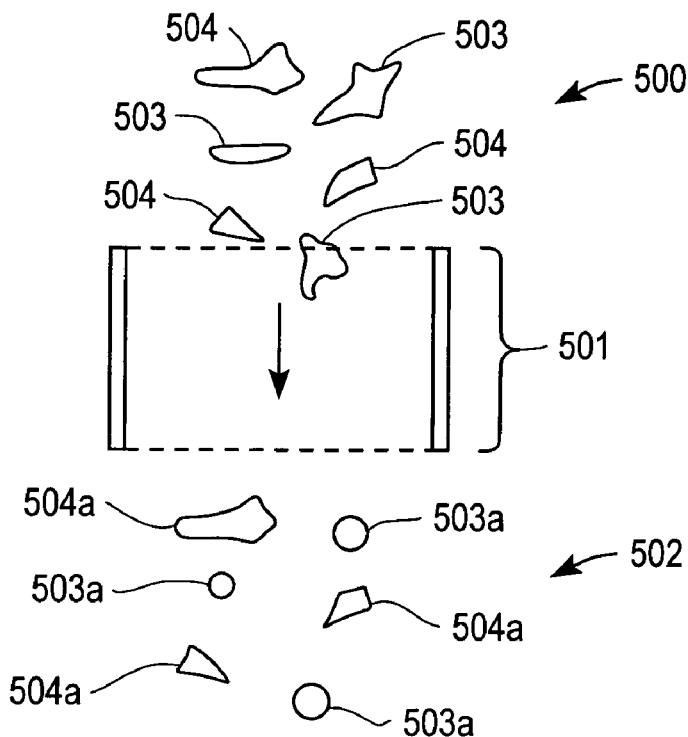
FIG. 11C schematically shows a preparatory material comprising low-melting-point particles and high-melting-point particles passing through a hot zone.

After formation, the preparatory material particles are directed towards the surface of a base through a hot zone. An exemplary method of carrying out this step is shown in FIGS. 11A and 11B. In FIG. 11A the preparatory material 100, which may have the same composition as shown in FIG. 10, is sprayed towards the base 113 using a nozzle 112. Particles leave the nozzle and travel through a hot zone 114 before arriving onto the base 113, which may comprise a substrate 116 coated with a conductor 117 such as W, Mo or Ta. The hot zone may be a zone comprising a flame, a hot gas, a laser beam or an oven or furnace section with microwave or electric heaters. Although the hot zone is shown as a narrow zone in FIG. 11A, it may actually be larger as shown in FIG. 11B. The larger hot zone 114b of FIG. 11B extends almost all the way from the nozzle to the base. In this case the nozzle may have to be cooled to assure that the particles do not melt before leaving the tip of the nozzle 112. The base 113 may also be heated or cooled down (not shown) to control its temperature and solidification of the material being deposited on it.

Figure 12A:
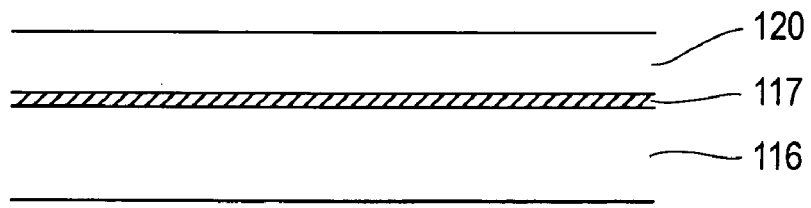
FIG. 12A shows a dense precursor layer deposited on a base using a preparatory material comprising particles, which are directed onto the base through a hot zone that melts substantially all the particles.

Referring back to FIG. 11A, the particles of the preparatory material leave the nozzle 112 as solid particles. Once they enter the hot zone 114, however, they melt at least partially. For the present example of a preparatory material comprising Cu—Ga solid solution particles and In particles, all particles may turn into molten particles while passing through the hot zone if a hot zone temperature of above 915° C. is employed. This is the temperature of melting for the Cu—Ga solid solution of this example. In this case molten droplets arrive on the base and form a dense precursor layer 120 over the conductor 117 as shown in FIG. 12A. Such a result may be obtained using, for example, a plasma spray gun commonly used to deposit high-melting temperature materials such as ceramics onto various substrates. Plasma or flame at the tip of such apparatus creates high temperature. If however, a hot zone providing only about 200-300° C. is employed, then the Cu—Ga solid solution particles, which have a melting point of about 915° C., would not melt. Indium particles with a melting point of 156° C., on the other hand, would melt and continue traveling towards the base through region 115 in the form of nano-size molten droplets. When the molten In droplets and solid Cu—Ga particles arrive on the surface of the conductor 117 they form a dense composite precursor layer 123 comprising Cu—Ga particles 121 embedded in an In matrix 122 as shown in FIG. 12B.

Figure 12B:
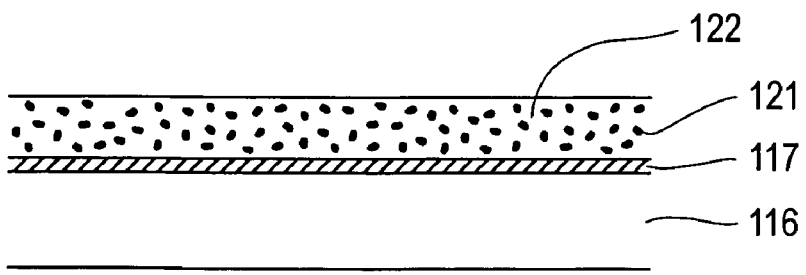
FIG. 12B shows a dense precursor layer deposited on a base using a preparatory material comprising particles, which are directed onto the base through a hot zone that melts only some of the particles.

The precursor layer 120 of FIG. 12A and composite precursor layer 123 of FIG. 12B both have the overall stoichiometry or composition of the preparatory material. The precursor layer 120 of FIG. 12A already has Cu, In and Ga well mixed. For the case of FIG. 12B, the composite precursor layer 123 has the Cu-rich particles distributed in an In-rich phase. To further improve local compositional uniformity of the composite precursor of FIG. 12B, the layer may be annealed at temperatures above 156° C., which is the melting temperature of In, for a period of time such as for 5-30 minutes. Alternately, further mixing takes place during the reaction step of FIG. 9 while the compound is being formed at temperatures, which are typically above 350° C.

It should be noted that the particles of the preparatory material may be coated by materials to help spray the powder in a more controlled manner. These coatings include thin layers of inorganic and organic matter covering the outer surface of the particles. These coatings are preferably organic coatings such as polymeric coatings that burn out or un-zip and evaporate due to heat as the particles travel through the hot zone. This way, particles can be sprayed efficiently due to the coatings on them, but any impurities that may be introduced due to the coatings are eliminated before they get deposited onto the base.

In another embodiment of the present invention a preparatory material in the form of a liquid such as a dispersion or ink may also be used instead of dry powder. In this case the particles of FIG. 10 are dispersed into a carrier liquid such as an alcohol, glycerol, organic solvents or water using well-known dispersion preparation techniques. The nozzle in this case sprays droplets of the carrier liquid, which comprise for example the Cu—Ga and In nano-particles. Passing through the hot zone the carrier liquid evaporates because of heat, leaving behind the solid particles, which then are either totally or partially melted as described above and deposit on the base. In addition to evaporating the carrier liquid heat from hot-zone may also remove any remaining organic matter on the particle surfaces due to additives such as surfactants, dispersing agents and thickening agents that are commonly employed to form a good dispersion.

The present invention addresses one of the important problems of prior-art techniques. As depicted in FIG. 2 porosity of precursor layers deposited by ink deposition approaches is an issue. As should be appreciated this porosity is also a function of the shape and size of the solid particles in the ink formulation. Particles that are spherical in shape typically give the highest density since they can be densely packed after the solvent used in ink formulation evaporates away and the solid content of the ink settles on the substrate to form a film. Particles with no definite shape, however, form a random matrix that is extremely porous with porosity over 50%. As described in the cited reference by Norsworthy et al., for example, the Cu—In alloy particles formed by milling Cu—In alloy powder were randomly shaped and when they were deposited on the substrate, their packing density was rather low. If such randomly shaped particles were used in the present invention as the preparatory material, however, they would be partially or totally melted going through the hot zone and therefore, they would become more spherical in shape before deposition on the base. Even if high melting-point particles remained randomly shaped going through the hot zone, the liquid droplets arriving onto the base together with them would effectively surround the randomly shaped particles and reduce porosity in the deposited precursor layer. FIG. 11C schematically shows initial particles 500 traveling into hot zone 501 in the direction shown by the arrow. The depositing particles 502 emerge from the hot zone and travel towards a base (nor shown) to be deposited. The initial particles 500 have random shapes and comprise low-melting-point initial particles 503 and high-melting-point initial particles 504. Once emerged from the hot zone 501, the high-melting-point initial particles 504 keep their shape substantially the same and are referred to as high-melting-point depositing particles 504*a*. Low-melting-point initial particles 503 emerging from the hot zone change into low-melting-point depositing particles 503*a*, which are more spherical in shape and they are smaller because they are molten. It should be noted that, in this example, the temperature of the hot zone is higher than the melting temperature of the low-melting-point particles and lower than the high-melting-point particles.

Although the invention has been described using Cu—Ga and In particles, particles with many other compositions may also be used as cited before. The preferred method is to have the low-melting phases (such as In and Ga) in one group of particles and high-melting phases in the other (such as Cu—Ga and Cu) so that low temperatures may be used in the hot zone. In other words one group of particles may be Group IB-rich and second group of particles maybe Group IIIA-rich. Obviously particles of various compositions may also be mixed to form the preparatory material. In other words there may be more than two types of particles in the mixture. If particles with multi-phase alloys are used, such particles would not totally melt at low temperatures. They would be partially melted. For example, if Cu—In—Ga particles are employed, these particles may comprise multiple Cu—In, Cu—Ga and In—Ga phases, all distributed within each particle. When such a particle passes through a hot zone kept at, for example, 300° C., the Ga and In-rich phases within each particle may melt but the Cu-rich phases may not. Therefore, when these particles arrive on the base they form a precursor film with less porosity compared to depositing the layer without using a hot zone, but more porosity compared to cases depicted in FIGS. 12A and 12B.

It should be understood that the present invention is applicable, in general, to the growth of $(Cu,Ag)_x(In,Ga,Al,Tl)_y(S,Se,Te,O)_z$ type compound films with various x, y and z values, including but not limited to layers of $CuInSe_2$, $CuGaSe_2$, $CuInS_2$, $CuGaS_2$, $CuIn(S,Se)_2$, $CuGa(S,Se)_2$, $Cu(In,Ga)Se_2$, $Cu(In,Ga)S_2$, and $Cu(In,Ga)(S,Se)_2$. It should be noted that there are also other Group IBIIIAVIA compounds (such as $CuIn_3Se_5$) where IB/IIIA molar ratio and (IB+IIIA)/VIA molar ratio are widely varied. The present invention is applicable to the growth of layers of such materials also.

As explained before when In and/or Ga melts are placed on a conductive surface such as the surface of an ohmic contact material to the solar cell, they wet the conductive surface well, especially if they are also physically rubbed against the surface using a soft material such as a buffing wheel, a piece of felt, cloth or cotton. This "mechanical" deposition approach may be effectively used to form thin layers of In, Ga or In—Ga alloys on Mo, W, Cu, Ta, glass, stainless steel surfaces and on other metal and insulator surfaces. This way the surfaces are prepared for better adhesion and wetting of the secondary layers such as precursor layers deposited on them. As described before, one method of treatment comprises a mechanical deposition step followed by wiping the deposited surface leaving behind a very thin layer which may be less than 100 nm in thickness, preferably less than 50 nm in thickness.

Examples above discussed different ways of carrying out the second step of the present invention as depicted in FIG. 9. Referring to FIG. 9 the third step of the invention is the reaction of the precursor layer. This may be achieved various ways. In one embodiment the precursor layer is exposed to Group VIA vapors at elevated temperatures. These techniques are well known in the field and they involve heating the precursor layer to a temperature range of 350-600° C. in the presence of at least one of Se vapors, S vapors, and Te vapors provided by sources such as solid Se, solid S, solid Te, $H_2Se$ gas, $H_2S$ gas etc. In another embodiment a layer or multi layers of Group VIA materials are deposited on the precursor layer and the stacked layers are then heated up in a furnace or in a rapid thermal annealing furnace and like. Group VIA materials may be evaporated on, sputtered on or plated on the precursor layer. Alternately inks comprising Group VIA nano particles may be prepared and these inks may be deposited on the precursor layers to form a Group VIA material layer comprising Group VIA nano particles.

Reaction may be carried out at elevated temperatures for times ranging from 1 minute to 30 minutes depending upon the temperature. As a result of reaction, a dense and high quality Group IBIIIAVIA compound layer is formed from the dense precursor films of the present invention. Solar cells are completed using materials and methods described previously.

As discussed before, transparent conductive oxides such as ZnO, Indium tin oxide and tin oxide are the commonly used transparent window layers in solar cell structures. These materials perform well, however, they are rather expensive to deposit, usually by MOCVD or sputtering techniques. In Group IBIIIAVIA solar cell structures these transparent conductive oxides are not active regions, rather they are passive elements just to carry the current. Therefore, a lower cost and more attractive option is the use of layers comprising carbon nanotubes. Carbon nanotubes are highly conductive and they are very transparent. They can be applied on surfaces as pure carbon nanotube layers or as layers of polymeric materials with carbon nanotubes dispersed in them for conductivity. In this case the solar cell structure is (contact)/(Group IBIIIAVIA material)/(CdS)/(ZnO)/(layer comprising carbon nanotubes), where the thicknesses of CdS and ZnO are preferably each less than 200 nm, since conductivity is provided by the layer comprising carbon nanotubes. It should be noted that the ZnO layer (or any other transparent conductive oxide used in place of it) is typically 500-2000 nm thick in standard solar cell structures to provide a sheet resistance value of typically less than 20 ohms per square. In the solar cell structure utilizing a layer comprising carbon nanotubes, the thin ZnO layer or the thin CdS layer (but not both) may also be eliminated without much deleterious effects to the device. If the layer comprising carbon nanotubes is a substantially polymeric layer, this layer may also act as a good encapsulating layer protecting the device from moisture and other atmospheric effects deleterious to Group IBIIIAVIA based thin film solar cells. If pure carbon nanotube layers are employed, these layers are porous. Therefore, additional polymeric material encapsulation would be needed to protect the solar cell and the integrity of the carbon nanotube layer.

Although the present invention has been described with reference to specific exemplary embodiments, it will be evident to one of ordinary skill in the art that various modifications and changes may be made to these embodiments without departing from the broader spirit and scope of the invention as set forth in the claims. Accordingly, the specification and drawings are to be regarded in an illustrative rather than a restrictive sense.

The invention claimed is:

1. A method comprising the steps of:
depositing a preparatory material in the form of a melt on a base to form a precursor layer, wherein the preparatory material comprises at least one Group IIIA material; and
reacting the precursor layer with at least one Group VIA material to form a dense Group IBIIIAVIA absorber layer.

2. The method of claim 1 further including the step of forming the preparatory material as a dispersion of particles; and wherein
the step of depositing directs the dispersion of particles toward the base through a hot zone located in proximity to the base, the hot zone evaporating a liquid that is within the dispersion of particles and substantially melting the dispersion of particles to obtain the melt before depositing of the melt on the base.

3. The method of claim 2 wherein the particles in the dispersion of particles are substantially all nano-particles.

4. The method of claim 3 wherein at least some of the particles in the dispersion of particles comprise a Group IB material.

5. The method of claim 4 wherein the Group IB material is Cu and the at least one Group IIIA material are indium and gallium.

6. The method of claim 5 further including a step of depositing at least one transparent layer over the absorber layer to form a solar cell.

7. The method of claim 6 wherein the at least one transparent layer includes CdS.

8. The method of claim 6 wherein the at least one transparent layer includes ZnO.

9. The method of claim 6 wherein the at least one transparent layer includes carbon nanotubes.

* * * * *